United States Patent
Chen et al.

(10) Patent No.: US 6,414,889 B1
(45) Date of Patent: Jul. 2, 2002

(54) METHOD AND APPARATUS THEREOF FOR BURN-IN TESTING OF A STATIC RANDOM ACCESS MEMORY

(75) Inventors: Jui-Lung Chen; Shih-Huang Huang, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/681,989

(22) Filed: Jul. 3, 2001

(51) Int. Cl.⁷ ............................................... G11C 7/00
(52) U.S. Cl. .................................................. 365/201
(58) Field of Search ............................ 365/201, 189.11, 365/226, 207

(56) References Cited

U.S. PATENT DOCUMENTS 5,379,260 A * 1/1995 McClure ..................... 365/201
5,463,585 A * 2/1995 Sanada ....................... 365/201

* cited by examiner

Primary Examiner—A. Zarabian
(74) Attorney, Agent, or Firm—Winston Hsu

(57) ABSTRACT

A apparatus uses a test method to perform burn-in testing of a static random access memory that has a plurality of word lines, a plurality of first bit lines, a plurality of second bit lines, and a plurality of memory cells for storing data. Each of the memory cells is coupled to a corresponding word line, a corresponding first bit line, a corresponding second bit line, and a power supply that is used to apply a working voltage to the memory cell to drive the memory cell. When the apparatus tests the static random access memory, the apparatus adjusts the working voltage according to a potential of the word lines and voltage gaps between the first bit lines and the second bit lines.

17 Claims, 5 Drawing Sheets

METHOD AND APPARATUS THEREOF FOR BURN-IN TESTING OF A STATIC RANDOM ACCESS MEMORY

BACKGROUND OF INVENTION

1. Field of the Invention

The present invention relates to a method and an apparatus thereof for testing a memory, more particularly, relates to a method and an apparatus thereof for testing a static random access memory (SRAM) in a burn-in test mode.

2. Description of the Prior Art

To ensure that a normal life failure rate of a static random access memory product meets or exceeds a design goal, a burn-in test is processed after the product is manufactured. In general, the static random access memory product has a plurality of memory cells. The purpose of the burn-in test is to accelerate effects of various failure mechanisms of the memory cells. When the burn-in test is processed, the memory cells of the SRAM are selected by turns and an exterior voltage higher than the supply voltage is applied to each of the selected memory cells to drive the selected memory cells to perform write and read operations repeatedly, thereby checking whether the selected memory cells are in a good state or in a bad state.

Please refer to FIG. 1. FIG. 1 is a schematic diagram of an apparatus 10 for testing a static random access memory 20 according to the prior art. The static random access memory 20 comprises a plurality of memory cells 22 for storing data, a plurality of word lines 24, a plurality of first bit lines 26, and a plurality of second bit lines 28. Each of the memory cells 22 is coupled to a corresponding word line 24, a corresponding first bit line 26, and a corresponding second bit line 28. The apparatus 10 comprises a control circuit 12 for controlling operations of the apparatus 10, a power supply 12 for providing each element of the apparatus 10 withelectric power, a column decoder 16, and a row decoder 18. Each of the memory cells 22 is coupled to the power supply 14. When the apparatus 10 tests the static random access memory 20, the control circuit 12 controls the column decoder 16 and the row decoder 18 to select an appropriate number of memory cells 22 so as to perform write and read operations sequentially, and the power supply 14 applies a working voltage Vcc of +5V to the selected memory cells 22 until the apparatus 10 accomplishes the test.

Please refer to FIG. 2. FIG. 2 is a schematic circuit diagram of the memory cell 22. The memory cell 22 comprises a storage circuit 32, a first switch circuit 34, and a second switch circuit 36. The storage circuit 32 is coupled to the power supply 14 and is capable of storing at least one binary bit of data. The first switch circuit 34 and the second switch circuit 36' are both coupled to the corresponding word line 24. The first switch circuit 34 is coupled to the corresponding first bit line 26, and the second switch circuit 36 is coupled to the corresponding second bit line 28. The memory cell 22 is composed of six metal-oxide-semiconductor field-effect transistors (MOSFETs) T1, T2, T3, T4, T5, and T6. The four transistors T1, T2, T5, and T6 are NMOS transistors, and the two transistors T3, and T4 are PMOS transistors. The storage circuit 32 is a complementary metal oxide semiconductor (CMOS) circuit composed of the NMOS storage transistors T1 and T2, and the PMOS load transistors T3 and T4. The first switch circuit 34 is composed of the NMOS access transistor T5, and the second switch circuit 36 is composed of the NMOS access transistor T6.

As mentioned above, when the apparatus 10 tests the static random access memory 20, the power supply 14 applies the working voltage Vcc of +5V to the selected memory cells until the test is completed. In a write operation of logic "1" data, the control circuit 12 applies a voltage to the word line 24 via the row decoder 18, thus, the transistors T5, and T6 are rendered conductive. Later, the control circuit 12 applies another voltage to the first bit line 26 via the column decoder 16, thus, a voltage gap is formed between the first bit line 26 and the second bit line 28, and node A goes high, so that the transistor T2 becomes conductive but the transistor T4 becomes non-conductive. As a result, node B goes low. In response to the voltage level of node B, the transistor T3 becomes conductive but the transistor T1 becomes non-conductive. Thus, node A goes high. To the contrary, in the case of logic "0" data write operation, the control circuit 12 also applies a voltage to the word line 24 via the row decoder 18, so that the transistors T5, and T6 are rendered conductive. Later, the control circuit 12 applies another voltage to the second bit line 28 via the column decoder, thus, another voltage gap is formed between the second bit line 28 and the first bit line 26, and node B goes high, so that the transistor T1 becomes conductive, but the transistor T3 becomes non-conductive. As a result, node A goes low. In response to the voltage level of node A, the transistor T4 becomes conductive but the transistor T2 becomes non-conductive, so that node B goes high. Briefly, data is stored as voltage levels with the two sides of the storage circuit 32 in opposite voltage configurations, that is, the node A is high and the node B is low in one state, and the node A is low and the node B is high in the other state. The following method is used to perform this operation:

(a) selecting an appropriate number of memory cells 22 to test, and applying the working voltage Vcc of +5V until the test is accomplished;
(b) applying a voltage to the word lines 24 coupled to the selected memory cells 22;
(c) forming voltage gaps between the first lines 26 and the second bit lines 28 that are coupled to the selected memory cells 22 so that the storage circuit 32 is able to store corresponding data.

Whenever the control circuit 12 processes the write operation, cell current, which flows from the first bit line 26 or the second bit line 28 to the memory cell 22, occurs. For instance, in a case of nodes A and B of FIG. 2 being retained as low and high, respectively (i.e., logic "0" data is stored in the memory cell 22), when a logic "1" data write operation begins, the transistors T5 and T6 are driven conductive. However, since the transistor T1 still remains conductive during early burn-in write operation, the cell current flows from the first bit line 26 through the transistors T5 and T1 to a ground terminal 38 of the memory cell 22. Moreover, the potential of node B is still higher than the potential of the second bit line 28 during early burn-in write operation, thus another cell current flows from the transistor T6 to the second bit line 28. On the contrary, in the case of logic "0" data write operation, the transistor T2 still remains conductive and the potential of node A is still higher than the potential of the first bit line 26 during early burn-in write operation, thus two cell currents flow from the second bit line 28 through the transistors T6 and T2 to another ground terminal 39 of the memory cell 22 and flow from the transistor T5 to the first bit line 26, respectively. Since the current load-carrying ability of the bit lines 26 and 28 is limited (i.e., 700 mA per bit line) to avoid burning down the static random access memory, the apparatus 10 must select a limited number of memory cells 22 to test at a time. Therefore, the test time is relatively long.

SUMMARY OF INVENTION

It is therefore an object of the present invention to provide an apparatus and a method thereof for burn-in testing of a static random access memory (SRAM) that has fewer cell current occurrences.

The present invention, briefly summarized, discloses a method and an associated apparatus for burn-in testing of a static random access memory. The static random access memory comprises a plurality of word lines, a plurality of first bit lines, a plurality of second bit lines, and a plurality of memory cells for storing data. Each of the memory cells is coupled to a corresponding word line, a corresponding first bit line, and a corresponding second bit line. The apparatus comprises a power supply for applying a working voltage to the memory cells so as to drive the memory cells, and a control circuit electrically connected to the power supply for controlling operations of the apparatus. When the apparatus tests the static random access memory, the control circuit selects an appropriate number of memory cells to test and adjusts a potential of the word lines coupled to the selected memory cells to exceed a first voltage value. The control circuit also forms voltage gaps between the first bit lines and the second bit lines and adjusts the voltage gaps to exceed a second voltage value. When the potential of the word lines coupled to the selected memory cells exceeds the first voltage value and the voltage gaps exceed the second voltage value, the control circuit pulls up the working voltage from a third voltage value to a fourth voltage.

It is an advantage of the present invention that by adjusting the working voltage applied to the selected memory cells, the magnitude of currents flowing through bit lines is reduced effectively. Therefore, the apparatus according to the present invention is capable of testing more memory cells at a time. Moreover, the test time is shortened.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
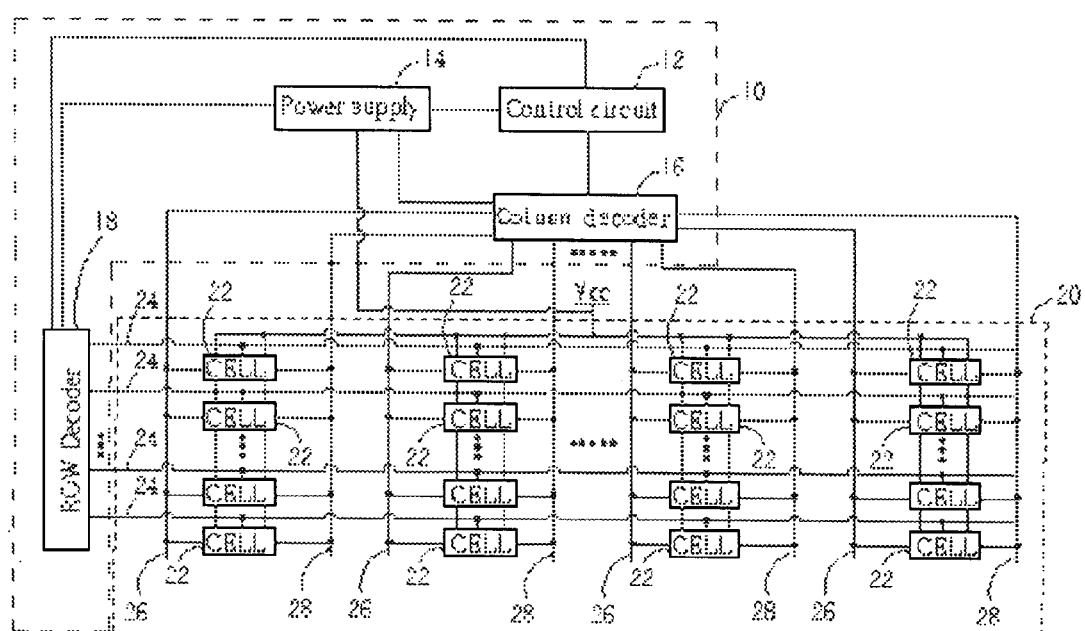
FIG. 1 is a schematic diagram of an apparatus for testing a static random access memory according to the prior art.
Figure 2:
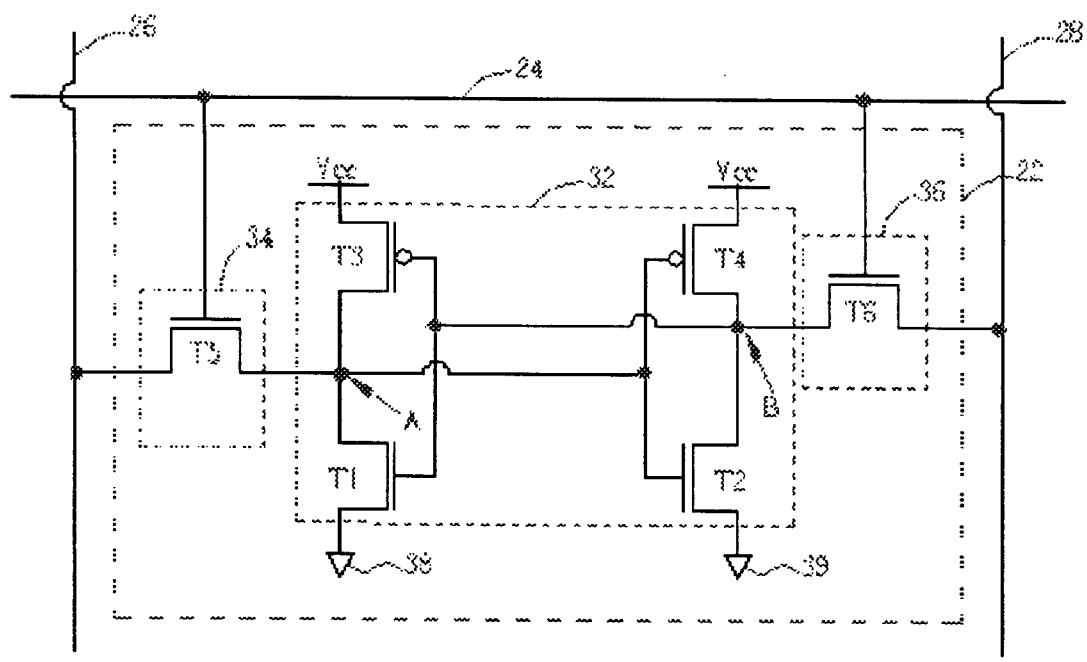
FIG. 2 is a schematic circuit diagram of a memory cell shown in FIG. 1.
Figure 3:
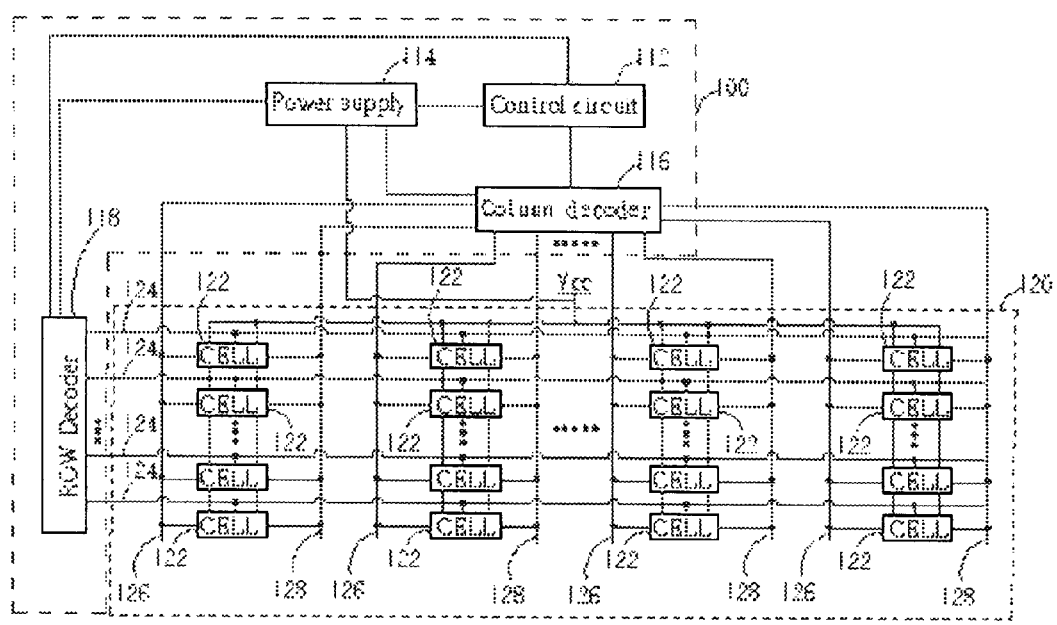
FIG. 3 is a schematic diagram of an apparatus for testing a static random access memory according to this invention.

Please refer to FIG. 3. FIG. 3 is a schematic diagram of an apparatus 100 for testing a static random access memory 120 according to this invention. Similar to the prior art, the static random access memory 120 comprises a plurality of memory cells 122 for storing data, a plurality of word lines 124, a plurality of first bit lines 126, and a plurality of second bit lines 128. Each of the memory cells 122 is coupled to a corresponding word line 124, a corresponding first bit line 126, and a corresponding second bit line 128. The apparatus 100 comprises a control circuit 112 for controlling the operations of the apparatus 100, a power supply 112 for providing each element of the apparatus 100 with electric power, a column decoder 116, and a row decoder 118. Each of the memory cells 122 is coupled to the power supply 114. When the apparatus 100 tests the static random access memory 120, the control circuit 112 controls the column decoder 116 and the row decoder 118 to select an appropriate number of memory cells 122 so as to perform write and read operations sequentially.

Figure 4:
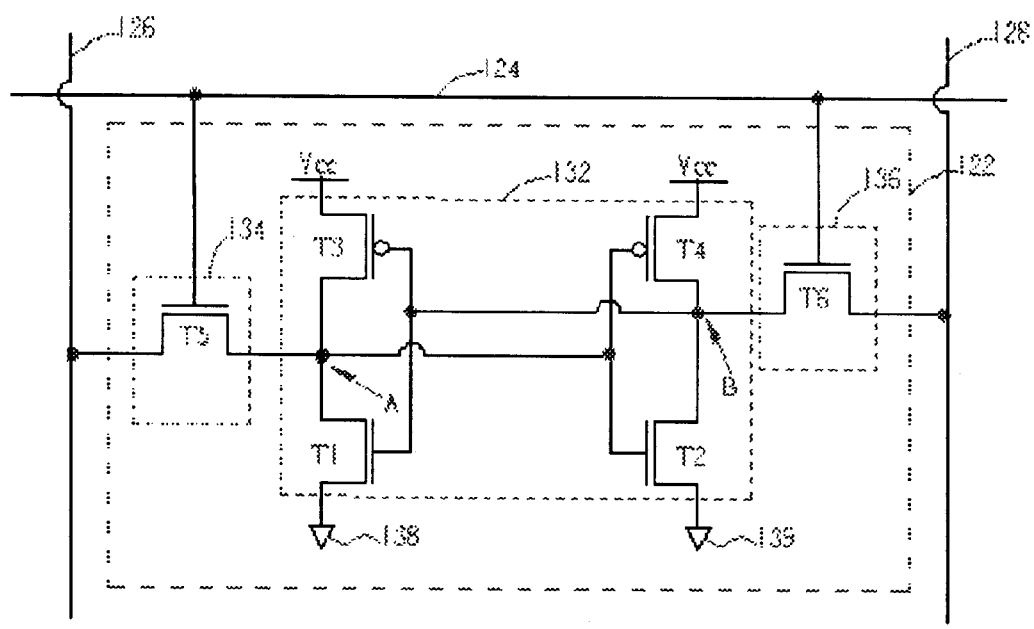
FIG. 4 is a schematic circuit diagram of a memory cell shown in FIG. 3.

Please refer to FIG. 4. FIG. 4 is a schematic circuit diagram of the memory cell 122. The memory cell 122 comprises a storage circuit 132, a first switch circuit 134, and a second switch circuit 136. The storage circuit 132 is coupled to the power supply 114 and is capable of storing at least one binary bit of data. The first switch circuit 134 and the second switch circuit 136 are both coupled to the corresponding word line 124. The first switch circuit 134 is coupled to the corresponding first bit line 126, and the second switch circuit 136 is coupled to the corresponding second bit line 128. The memory cell 122 is composed of six metal-oxide-semiconductor field-effect transistors (MOSFETs) T1, T2, T3, T4, T5, and T6. The four transistors T1, T2, T5, and T6 are NMOS transistors, and the two transistors T3, and T4 are PMOS transistors. The storage circuit 132 is a complementary metal oxide semiconductor (CMOS) circuit composed of the NMOS storage transistors T1 and T2, and the PMOS load transistors T3 and T4. The first switch circuit 134 is composed of the NMOS access transistor T5, and the second switch circuit 136 is composed of the NMOS access transistor T6.

Figure 5:
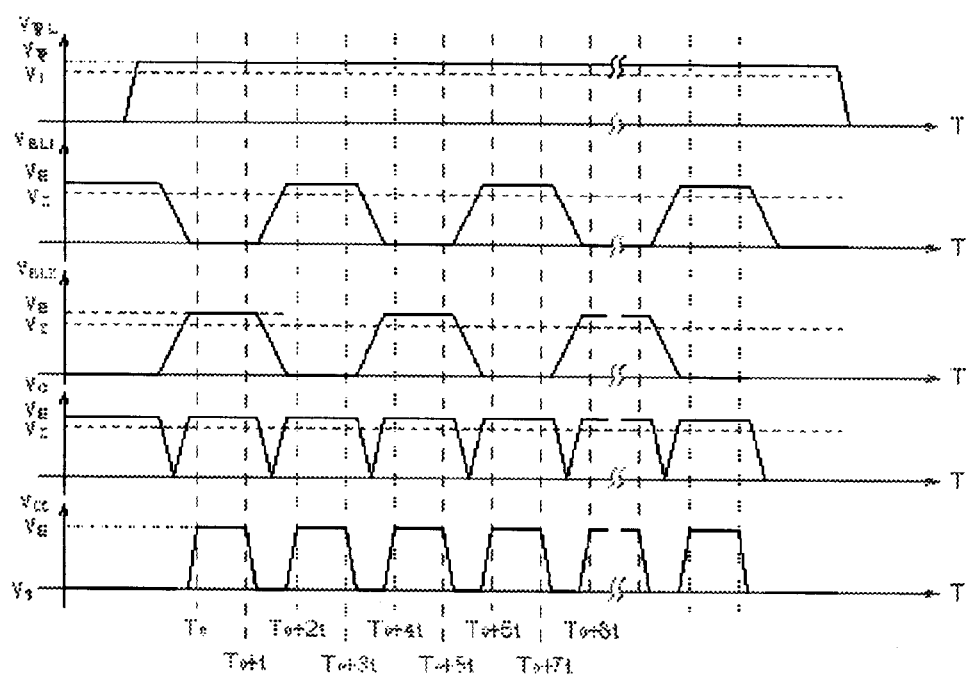
FIG. 5 is a timing diagram of voltages that are applied on corresponding nodes of the memory cell shown in FIG. 4.

Please refer FIG. 4 and FIG. 5. FIG. 5 is a timing diagram of voltages which are applied on corresponding nodes of the memory cell 122. When the apparatus 100 tests the static random access memory 120, the control circuit 112 applies a word line voltage to the word lines 124 coupled to the selected memory cells so as to adjust the potential of the word lines $V_{WL}$ to exceed a first voltage value $V_1$. The control circuit 112 also applies two complementary periodic voltage signals $V_{BL1}$ and $V_{BL2}$ to the first bit lines 126 and the second bit lines 128 that are coupled to the selected memory cells 122. The voltage signal $V_{BL1}$ is applied to the first bit lines 126, and the voltage signal $V_{BL2}$ is applied to the second bit lines 128. The two voltage signals $V_{BL1}$ and $V_{BL2}$ have the same period 4t so that voltage gaps $V_G$ are formed between the first bit lines 126 and the second bit lines 128 at periodic intervals. The value of the voltage gaps $V_G$ are equal to $|V_{BL1}-V_{BL2}|$. When the apparatus 100 tests the SRAM 120, the control circuit 112 adjusts the working voltage Vcc according to the word line voltage $V_{WL}$ and the voltage gaps $V_G$. As shown in FIG. 5, when the potential of the word lines $V_{WL}$ exceeds the first voltage value $V_1$ and the potential of the voltage gaps $V_G$ exceeds the second voltage value $V_2$, the control circuit 112 pulls up the working voltage Vcc from a third voltage value $V_3$ to a fourth voltage value $V_4$, wherein the third voltage value $V_3$ is equal to zero. In other words, the sources of the transistors T3 and T4 are grounded when the word line voltage $V_{WL}$ does not exceed the first voltage value $V_1$ and the voltage gaps $V_G$ do not exceed the second voltage value $V_2$. In contrast to the prior art, the working voltage Vcc is applied to the memory cells 122 only when the potential of the word lines $V_{WL}$ exceeds the first voltage value $V_1$ and the voltage gaps $V_G$ exceed the second voltage value $V_2$.

The control circuit 112 applies the two complementary periodical voltage signals $V_{BL1}$ and $V_{BL2}$ to the first bit lines 126 and the second bit lines 128 so as to adjust the voltage gaps $V_G$, and also to change the logic data stored in the storage circuit 132. Please refer to FIG. 5, where when after the potential $V_{WL}$ is pulled up to the voltage value $V_W$, which is larger than the first voltage value $V_1$, the control circuit applies the two voltage signals $V_{BL1}$ and $V_{BL2}$ to the corresponding first bit lines 126 and the corresponding second bit lines 128 so as to adjust the voltage gaps $V_G$ periodically. When the potential of the word lines $V_{WL}$ is equal to $V_W$, and the potential of the first lines is equal to $V_H$ and the potential of the second lines is equal to zero, the control circuit 112 pulls the working voltage Vcc to the fourth voltage $V_4$ so that the logic "1" data are stored in the storage circuits 132 of the selected memory cells 122. To the contrary, when the potential of the word lines 124 is equal to $V_W$, and the potential of the first bit lines 126 is equal to zero, and the potential of the first bit lines is equal to $V_H$, the control circuit 112 pulls the working voltage Vcc to the fourth voltage $V_4$ so that the logic "0" data are stored in the storage circuits 132. Moreover, when the voltage gaps $V_G$ are less than the second voltage value $V_2$, the control circuit 112 stops applying the working voltage Vcc to the selected memory cells 122 or adjusting the working voltage Vcc to be less than the fourth voltage $V_4$. Therefore, during an entire burn-in logic "1" data write operation, the transistor T1 is non-conductive and the potential of node B is not higher than the potential of the second bit line 128, so that no cell current flows from the first bit line 126 to a first ground terminal of the storage circuit 138, or flows from the transistor T6 to the second bit line 128. On the contrary, during an entire burn-in logic "0" data write operation, the transistor T2 is non-conductive and the potential of node A is not higher than the potential of the first bit line 126, so that no cell current flows from the second bit line 128 to a second ground terminal of the storage circuit 139, or flows from the transistor T5 to the first bit line 126. Therefore, the magnitude of currents that flow through bit lines 126 and 128 could be reduced effectively. The apparatus 100 is capable of testing more memory cells 122 at a time, and the test time is shortened.

The method according to the present invention comprises the following steps:

(a) selecting an appropriate number of memory cells 122 to test via the column decoder 116 and the row decoder 118;

(b) adjusting the potential of the word lines coupled to the selected memory cells $V_{WL}$ to exceed the first voltage value $V_1$;

(c) forming voltage gaps $V_G$ between the first bit lines 126 and the second bit lines 128 that are coupled to the selected memory cells 122, and adjusting the voltage gaps $V_G$ to exceed the second voltage value $V_2$; and (d) pulling up the working voltage Vcc from the third voltage value $V_3$ to the fourth voltage $V_4$ when the potential of the word lines $V_{WL}$ exceeds the first voltage value $V_1$ and the voltage gaps $V_G$ exceed the second voltage value $V_2$.

Moreover, if the control circuit 122 forms the voltage gaps $V_G$ by means of applying the two complementary periodical voltage signals $V_{BL1}$ and $V_{BL2}$ to the first bit lines 126 and the second bit lines 128, the method further comprises the following steps: (e) adjusting the working voltage Vcc to be less than the fourth voltage $V_4$ or stopping application of the working voltage Vcc to the selected memory cells 122 when the voltage gaps V are less than the second voltage value $V_2$; and (f) pulling up the working voltage Vcc to the fourth voltage $V_4$ when the voltage gaps $V_G$ exceed the second voltage value $V_2$.

In fact, the apparatus 100 does not have to comprise the column 116 and the row 118, and all of the memory cells 122 of the static random access memory 120 could be selected by the control circuit 112 to be tested simultaneously. When the apparatus 100 tests the SRAM 120, the control circuit 112 controls the power supply 114 to apply corresponding voltages to the word lines 124, the first bit lines 126, and the second bit lines 128 directly. Moreover, since the currents flowing through the bit lines 126 and 128 to the memory cells 122 are reduced (i.e., 20 μA per memory cell), the apparatus 100 could be used to test a wafer (not shown) that comprises a plurality of static random access memories 120 in a wafer burn-in test mode. The apparatus 100 is able to test all the memory cells 122 of the static random access memories 120 in the wafer simultaneously by producing bit line currents that are matched with the current load-carrying ability of the bit lines 126 and 128.

In contrast to the prior art, the present invention adjusts a working voltage that is used to drive selected memory cells of a static random access memory according to voltages applied to the word lines and the bit lines that are coupled to the selected memory cells. Consequently, currents flowing through the bit lines to the selected memory cells are reduced, and more memory cells could be selected to test at a time. The test time, thus, is shortened.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for burn-in testing of a static random access memory, the static random access memory comprising:
   a plurality of word lines;
   a plurality of first bit lines;
   a plurality of second bit lines; and
   a plurality of memory cells for storing data, each of the memory cells being coupled to a corresponding word line, a corresponding first bit line, a corresponding second bit line, and a power supply that is used to apply a working voltage to the memory cell to drive the memory cell;
   the method comprising:
      selecting an appropriate number of memory cells to test;
      adjusting a potential of the word lines coupled to the selected memory cells to exceed a first voltage value;
      forming voltage gaps between the first bit lines and the second bit lines that are coupled to the selected memory cells, and adjusting the voltage gaps to exceed a second voltage value; and
      pulling up the working voltage from a third voltage value to a fourth voltage when the potential of the word lines exceeds the first voltage value and the voltage gaps exceed the second voltage value.

2. The method of claim 1 wherein the third voltage value is equal to zero.

3. The method of claim 1 further comprising:
   applying two complementary periodical voltage signals to the first bit lines and the second bit lines that are coupled to the selected memory cells to form the voltage gaps at periodic intervals.

4. The method of claim 3 further comprising:
   stop applying the working voltage to the selected memory cells when the voltage gaps are less than the second voltage value; and
   pulling up the working voltage to the fourth voltage when the voltage gaps exceed the second voltage value.

5. The method of claim 3 further comprising:
   adjusting the working voltage to be less than the fourth voltage when the voltage gaps are less than the second voltage value; and pulling up the working voltage to the fourth voltage when the voltage gaps exceed the second voltage value.

6. The method of claim 1 wherein each of the memory cells comprises a storage circuit, a first switch circuit, and a second switch circuit, the storage circuit being coupled to the power supply and being capable of storing at least one binary bit of data, the first switch circuit and the second switch circuit both being coupled to the corresponding word line, the first switch circuit being coupled to the corresponding first bit line, and the second switch circuit being coupled to the corresponding second bit line.

7. The method of claim 6 wherein the storage circuit is a CMOS circuit.

8. The method of claim 1 wherein all of the memory cells of the static random access memory are selected to be tested simultaneously.

9. An apparatus for burn-in testing of a static random access memory, the static random access memory comprising:
   a plurality of word lines;
   a plurality of first bit lines;
   a plurality of second bit lines; and
   a plurality of memory cells for storing data, each of the memory cells being coupled to a corresponding word line, a corresponding first bit line, and a corresponding second bit line;
   the apparatus comprising:
      a power supply for applying a working voltage to the memory cells to drive the memory cells; and
      a control circuit electrically connected to the power supply for controlling operations of the apparatus;
      wherein when the apparatus tests the static random access memory, the control circuit selects an appropriate number of memory cells to test and adjusts a potential of the word lines coupled to the selected memory cells to exceed a first voltage value, the control circuit also forming voltage gaps between the first bit lines and the second bit lines and adjusting the voltage gaps to exceed a second voltage value, and when the potential of the word lines coupled to the selected memory cells exceeds the first voltage value and the voltage gaps exceed the second voltage value, the control circuit pulls up the working voltage from a third voltage value to a fourth voltage.

10. The apparatus of claim 9 wherein the third voltage value is equal to zero.

11. The apparatus of claim 9 further comprising a row decoder and a column decoder, the control circuit selecting memory cells to test via the row decoder and the column decoder.

12. The apparatus of claim 9 wherein the control circuit applies two complementary periodical voltage signals to the first bit lines and the second bit lines that are coupled to the selected memory cells to form the voltage gaps at periodic intervals.

13. The apparatus of claim 12 wherein when the voltage gaps are less than the second voltage value, the control circuit stops applying the working voltage to the selected memory cells, and when the voltage gaps exceed the second voltage value, the control circuit pulls up the working voltage to the fourth voltage.

14. The apparatus of claim 12 wherein when the voltage gaps are less than the second voltage value, the control circuit adjusts the working voltage to be less than the fourth voltage, and when the voltage gaps exceed the second voltage value, the control circuit pulls up the working voltage to the fourth voltage.

15. The apparatus of claim 9 wherein each of the memory cells comprises a storage circuit, a first switch circuit, and a second switch circuit, the storage circuit being coupled to the power supply and being capable of storing at least one binary bit of data, the first switch circuit and the second switch circuit both being coupled to the corresponding word line, the first switch circuit being coupled to the corresponding first bit line, and the second switch circuit being coupled to the corresponding second bit line.

16. The apparatus of claim 15 wherein the storage circuit is a CMOS circuit.

17. The apparatus of claim 9 wherein all of the memory cells of the static random access memory are selected to be tested simultaneously.

* * * * *